(12) United States Patent
Anraku

(10) Patent No.: US 6,215,719 B1
(45) Date of Patent: Apr. 10, 2001

(54) MEMORY DEVICE HAVING LINE ADDRESS COUNTER FOR MAKING NEXT LINE ACTIVE WHILE CURRENT LINE IS PROCESSED

(75) Inventor: Yukihiro Anraku, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/468,545

(22) Filed: Dec. 21, 1999

(30) Foreign Application Priority Data

Dec. 22, 1998 (JP) .................................................. 10-365556

(51) Int. Cl.⁷ ...................................................... G11C 8/00
(52) U.S. Cl. ............................... 365/230.03; 365/189.04; 365/189.08; 365/230.09
(58) Field of Search ..................... 365/230.03, 189.04, 365/230.09, 233, 189.08

(56) References Cited

U.S. PATENT DOCUMENTS

| | | | |
|---|---|---|---|
| 5,274,596 | * 12/1993 | Watanabe | 365/203 |
| 5,506,810 | * 4/1996 | Rumas | 365/230.03 |
| 5,598,372 | * 1/1997 | Matsumoto et al. | 365/230.01 |
| 5,691,955 | * 11/1997 | Yamauchi | 365/233 |

FOREIGN PATENT DOCUMENTS

| | | |
|---|---|---|
| 58-115684 | 7/1983 | (JP) . |
| 60-253087 | 12/1985 | (JP) . |
| 3-61276 | 9/1991 | (JP) . |
| 4-311896 | 11/1992 | (JP) . |
| 6-131248 | 5/1994 | (JP) . |

* cited by examiner

Primary Examiner—Richard Elms
Assistant Examiner—Hien Nguyen
(74) Attorney, Agent, or Firm—Foley & Lardner

(57) ABSTRACT

A memory device is disclosed, in which the operation of selecting the next line and relevant column addresses is unnecessary, thereby improving the data-writing/reading speed in comparison with the conventional DRAM. The memory device comprises a memory cell comprising at least two banks; and a line-address counting section for making a designated line of one of the banks active, wherein before reading or writing operation of data of the designated line is finished, the line-address counting section makes the next designated line of another bank active.

5 Claims, 1 Drawing Sheet

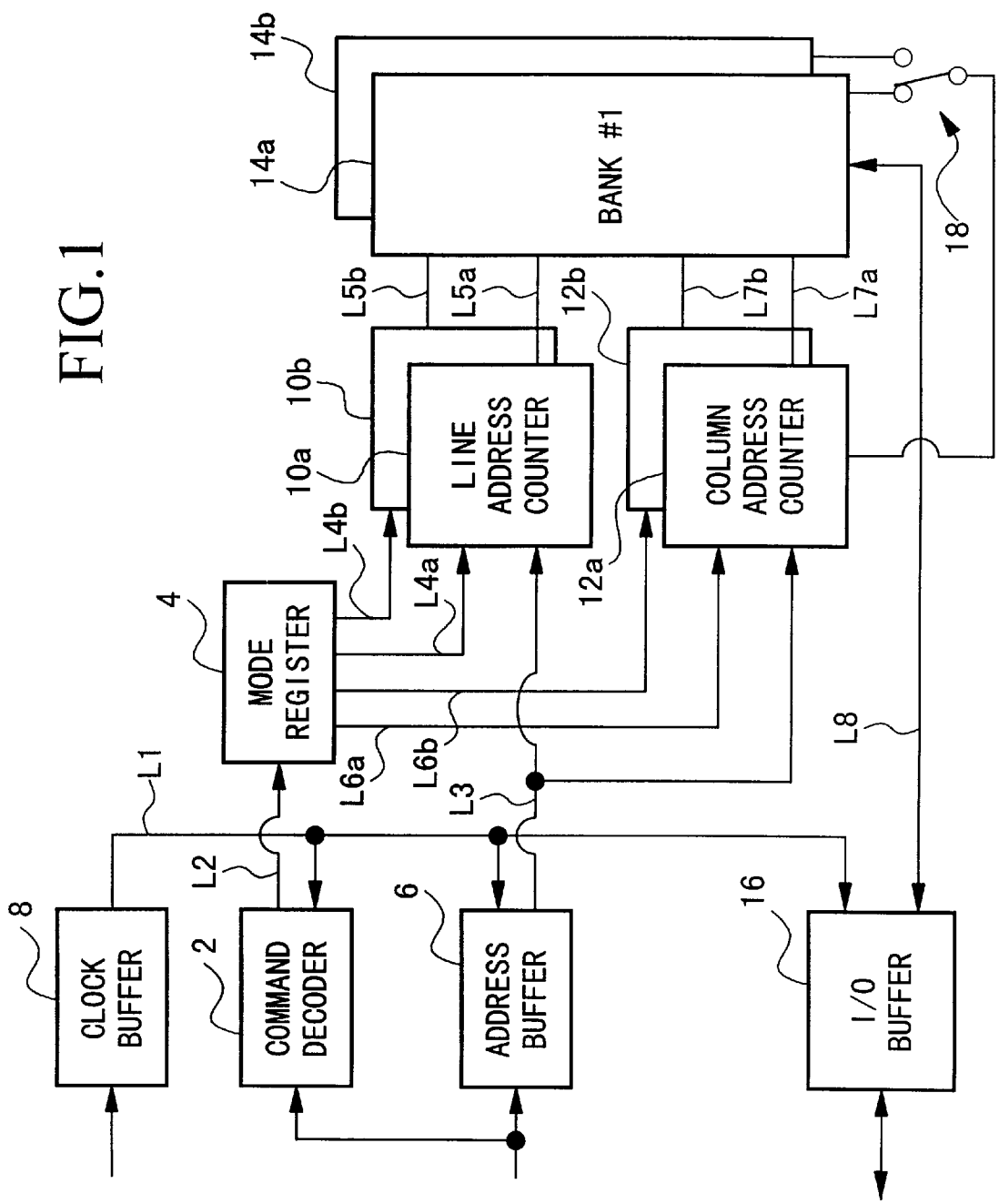

MEMORY DEVICE HAVING LINE ADDRESS COUNTER FOR MAKING NEXT LINE ACTIVE WHILE CURRENT LINE IS PROCESSED

BACKGROUND OF THE INVENTION

1. Field of the Invention

The present invention relates to a memory device, in particular, to a DRAM (dynamic random access memory) used as a main memory in a computer or the like.

This application is based on Patent Application No. Hei 10-365556 filed in Japan, the contents of which are incorporated herein by reference.

2. Description of the Related Art

In consideration of the manufacturing costs and so on, DRAMs are generally used as the main memory of a computer or the like. In the operation of continuously reading or writing internal data of the DRAM, a command used for such a continuous operation is set in advance in the DRAM, a line address is selected, and then column addresses are selected. In order to continuously read or write the data of the next line, a similar operation is necessary, that is, the address signal of the next line must be selected, and then the addresses of the relevant columns must be selected.

In addition, a dedicated memory device in which the above-explained continuous reading/writing operation is possible is known; however, in such a device, the speed of reading or writing data is important and thus the random access function is impossible. That is, in the conventional memory device, the random access function and the continuous reading/writing function (of the line and column addresses) are incompatible.

As described above, in the operation of continuously reading or writing internal data in the DRAM, a command assigned to such a continuous operation is set in advance in the DRAM, a line address is selected, and then column addresses are selected, thereby starting the continuous reading or writing operation.

If it is assumed that line address A is selected, after the data of the last column in the designated line of address A is read or written, the data of the first column of the next line of address A+1 is continuously read or written. At this line shift, it is also necessary to select the next-line address A+1 and the relevant column address, that is, the time for selecting the above line address A+1 and the column address is necessary, so that it is very difficult to further improve the data reading/writing speed.

SUMMARY OF THE INVENTION

In consideration of the above circumstances, an objective of the present invention is to provide a memory device in which when the data of the next address is continuously read or written, the operation of selecting the next line and relevant column addresses is unnecessary, thereby improving the data-writing/reading speed in comparison with a conventional DRAM.

Therefore, the present invention provides a memory device comprising:

a memory cell comprising at least two banks; and
a line-address counting section for making a designated line of one of the banks active, wherein before a reading or writing operation of data of the designated line is finished, the line-address counting section makes the next designated line of another bank active.

In the above structure, the line-address counting section may consist of line address counters provided corresponding to each bank.

The above memory device may further comprise column address counters, provided corresponding to each bank, for making columns of the relevant bank active.

Additionally, the memory device may further comprise a bank selecting switch for selecting one of the banks, wherein when the counting operation of the column address counter provided for a bank is finished, the bank selecting switch switches the current bank and selects another bank, and another column address counter provided for the selected bank starts counting.

According to the present invention, it is possible to omit the time necessary for selecting the following line and relevant column addresses, and thus the data reading/writing speed can be improved.

BRIEF DESCRIPTION OF THE DRAWINGS

FIG. 1 is a block diagram showing the structure of the memory device as an embodiment according to the present invention.

DESCRIPTION OF THE PREFERRED EMBODIMENTS

Hereinafter, the memory device as an embodiment according to the present invention will be explained in detail with reference to the drawings.

FIG. 1 is a block diagram showing the structure of the memory device of the embodiment.

In FIG. 1, the memory device comprises command decoder 2 for decoding the refresh, write, and read commands, which are used in the conventional DRAM, and a command of a continuous read/write operation with respect to a series of line addresses; mode register 4 for providing each command decoded by the command decoder 2; address buffer 6 for receiving an address sent from an external device; clock buffer 8 for receiving the reference clock (of this memory device) sent from an external device and providing a clock signal to each block of the memory device; line address counters 10a and 10b for automatically generating necessary line addresses; column address counters 12a and 12b for automatically generating necessary column addresses; memory-cell banks 14a and 14b; and I/O buffer 16 for inputting/outputting data from/to an external device.

The memory-cell banks 14a and 14b are independent of each other. That is, basically, the contents stored in bank 14a do not relate to those stored in bank 14b. The memory structure of these banks is, for example, 1024 lines×1024 columns.

Reference numeral 18 indicates a bank selecting switch for choosing one of memory-cell banks 14a and 14b to be connected.

Below, the operation of the memory device of the present embodiment will be explained.

First, the reference clock is input from an external device into the memory device, and the clock buffer 8 receives this reference clock. This clock signal is output via signal line L1 to command decoder 2, address buffer 6, and I/O buffer 16. The internal operation of the memory device of the present embodiment is performed based on this reference clock.

The command decoder 2 receives the command of a continuous reading/writing operation (with respect to a series of line addresses) from an external device, and sends this command via signal line L2 to mode register 4. When the command is set in the mode register 4, the continuous read/write command becomes effective inside the memory.

Next, an initial address with respect to the continuous reading/writing operation is input into the address buffer 6, which is then input via signal line L3 into line address counters 10a and 10b and column address counters 12a and 12b, so that the top line address and top column address are determined.

The command set and stored in the mode register 4 is then output via signal lines L4a and L4b to the line address counters 10a and 10b, and after this operation, these line address counters automatically generate suitable line addresses. The generated line addresses are output via signal lines L5a and L5b to memory-cell banks 14a and 14b.

The address request to the memory-cell banks 14a and 14b is sent using the interleave method.

The command from the mode register 4 is output via signal lines L6a and L6b into column address counters 12a and 12b, so that these column address counters 12a and 12b automatically generate suitable column addresses after this.

The above column addresses are output via signal lines L7a and L7b into memory-cell banks 14a and 14b.

When a top line address and a top column address are selected, the column address is automatically generated by the column address counters 12a and 12b and the address processing operation is executed.

Here, it is assumed that the bank selecting switch 18 is connected to the memory-cell bank 14a. When the memory-cell bank 14a is selected as this, the line address counter 10a makes the designated line active, and the column address counter 12a counts the column addresses in turn, so that the address counting operation of the column address counter 12a progresses. Before the last column address in the current line is counted, the line address counter 10b is activated so as to make the next line active, in which the data continuous to those of the currently designated line of bank 14a are stored.

For example, if a series of data are stored in the order of the first line of bank 14a, the first line of bank 14b, the second line of bank 14a, the second line of bank 14b, . . . , when the 100th line is made active by the line address counter 10a, the address counter 10b then makes the 100th line of bank 14b active.

That is, in the present embodiment, before the column address counter 12a counts the last-column address of the current line, the line address counter 10b is operated so as to make the next-designated line of bank 14b active. Here, the timing of making the line active is, for example, when the column address counter 12a counts the address of a column located approximately 5 columns earlier than the last column.

When the column address counter 12a finally counts the address of the last column, the bank selecting switch 18 is operated so as to switch the connected bank from 14a to 14b, and simultaneously, the column address counter 12b starts counting.

As described above, the designated line of bank 14b has already been made active by the line address counter 10b; thus, when the column address counter 12b starts the counting, the relevant stored data can be read or written, that is, the continuous reading or writing operation from bank 14a to bank 14b is immediately executed.

The switching operation from bank 14b to 14a is similarly performed, that is, before the counting of the column address counter 12b is finished, the line address counter 10a makes the next designated line of bank 14a active.

The bidirectional read/write data transmission is performed via line L8 between the banks 14a and 14b and the I/O buffer 16.

According to the above-explained memory device as an embodiment of the present invention, when the data of a series of line addresses of a DRAM are continuously read or written, the conventional address designating operation is necessary only for the top line and column addresses, and unnecessary for the following addresses by using the line address counter 10b and the column address counter 12b in the DRAM. Therefore, in the continuous data reading/writing operation, it is possible to omit the time necessary for selecting such following line and column addresses, thereby improving the data reading/writing speed.

What is claimed is:

1. A memory device comprising:
   a memory cell comprising at least two banks; and
   a line-address counting section for receiving an initial address and a command of a continuous reading or writing operation, and automatically generating following addresses based on the input initial address and the command, and continuously making each designated line of one of the banks, designated by each address, active, wherein before a reading or writing operation of data of the designated line is finished, the line-address counting section makes the next designated line of another bank active.

2. The memory device as claimed in claim 1, wherein the line-address counting section consists of a plurality of line address counters, each line address counter of the plurality of line address counters provided for a corresponding bank.

3. The memory device as claimed in claim 2, further comprising:
   a plurality of column address counters, each column address counter of the plurality of column address counters provided for a corresponding bank, for making columns of the corresponding bank active, wherein:
   the column address counters receive an initial address and the command of a continuous reading or writing operation, and automatically generate following addresses based on the input initial address and the command, and continuously make each column designated by each address active.

4. The memory device as claimed in claim 3, further comprising:
   a bank selecting switch for selecting one of the banks, wherein when the counting operation of one of the column address counters which is provided for a selected bank is finished, the bank selecting switch switches the selected bank and selects another bank, and another column address counter provided for the another selected bank starts counting.

5. The memory device as claimed in claim 3, wherein the line-address counting section makes the next designated line of a selected bank active when a column address provided for a current bank counts an address of a column located approximately five columns earlier than the last column of the designated line of the current bank.

* * * * *